(12) United States Patent
Takahashi

(10) Patent No.: US 6,504,454 B2
(45) Date of Patent: Jan. 7, 2003

(54) LONGITUDINALLY COUPLED SURFACE ACOUSTIC WAVE FILTER

(75) Inventor: Naoki Takahashi, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 09/913,052

(22) PCT Filed: Jan. 22, 2001

(86) PCT No.: PCT/JP01/00378
§ 371 (c)(1),
(2), (4) Date: Aug. 7, 2001

(87) PCT Pub. No.: WO01/56151
PCT Pub. Date: Aug. 2, 2001

(65) Prior Publication Data
US 2002/0135441 A1 Sep. 26, 2002

(30) Foreign Application Priority Data
Jan. 28, 2000 (JP) .................................. 2000-020779

(51) Int. Cl.[7] ................................................ H03H 9/64

(52) U.S. Cl. .................................... 333/195; 310/313 D

(58) Field of Search ................................. 333/193–196; 310/313 R, 313 B, 313 C, 313 D

(56) References Cited
FOREIGN PATENT DOCUMENTS

| JP | 8-213876 | * 8/1996 |
|---|---|---|
| JP | H10-290141 | 10/1998 |
| JP | H2000-49558 | 2/2000 |

* cited by examiner

*Primary Examiner*—Robert Pascal
*Assistant Examiner*—Barbara Summons
(74) *Attorney, Agent, or Firm*—Koda & Androlia

(57) ABSTRACT

In a filter in which first-order to third-order. double mode SAW filters each including three IDT electrodes having an electrode finger pitch L1 are cascaded, to flatten the passband of the filter and reduce the VSWR to 2 or lower, a pitch of electrode fingers of the IDT electrode in the center of one of the double mode SAW filters is set as L2, the electrode fingers of the IDT electrode are eliminated by the same number from both sides, and the eliminated electrode fingers are replaced by dummy electrodes having a pitch L2. L2 is set to be higher than L1.

4 Claims, 7 Drawing Sheets

Imp. Zo= 50Ω  Freq. = 856.500 ~ 906.500 MHz

Imp. Zo= 50Ω  Freq. = 856.500 ~ 906.500 MHz

Imp. Zo= 50Ω   Freq. = 856.500 ~ 906.500 MHz

Imp. Zo= 50Ω   Freq. = 856.500 ~ 906.500 MHz

LONGITUDINALLY COUPLED SURFACE ACOUSTIC WAVE FILTER

TECHNICAL FIELD

The present invention relates to a surface acoustic wave filter and, more particularly, to a surface acoustic wave filter having a flattened passband characteristic of a cascaded double mode SAW filter in which input and output impedances are different from each other.

BACKGROUND ART

In recent years, a surface acoustic wave filter is widely used in the field of communications. Since the surface acoustic wave filter has excellent characteristics such as high performance, small size, and manufacturability, it is often used particularly in a portable telephone and the like.

FIG. 5 is a plan view showing the configuration of a conventional filter in which longitudinally coupled double mode SAW filters using the first and the third modes (hereinafter, referred to double mode SAW filters) are cascaded. A first double mode SAW filter is constructed by disposing three IDT electrodes 11, 12, and 13 side by side between grating reflectors 14a, 14b (hereinafter, referred to reflectors) along a direction of propagation of a surface wave on the principal plane of a piezoelectric substrate P. Further, in parallel with the first double mode SAW filter, a second double mode SAW filter is constructed by disposing three IDT electrodes 15, 16,.and 17 side by side between reflectors 18a and 18b. By cascading the first and second double mode SAW filters, a cascaded double mode SAW filter is constructed.

Each of the IDT electrodes 11, 12, and 13 constructing the first double mode SAW filter is made by a pair of interdigital electrodes having a plurality of electrode fingers which positioned between the electrode fingers of the other interdigital electrode. One of the interdigital electrodes of the center IDT electrode 11 is connected to an input terminal IN, and the other interdigital electrode is grounded. Further, one of the interdigital electrodes of each of the IDT electrodes 12 and 13 is connected to an input of the second double mode SAW filter and the other interdigital electrode is grounded. The first and second double mode SAW filters are of symmetrical configuration.

The second double mode SAW filter is constructed almost similar to the first double mode SAW except to the point that the number of pairs of electrode fingers of the center IDT electrode 15 is smaller than that of the IDT electrode 11 in the first double mode SAW filter, and interdigital dummy electrodes D1 and D2 having electrode fingers of the number equal to the balance of the number of electrode fingers are provided and connected to the interdigital electrode on the earth side. By the configuration, an input impedance is set to be low (for example, 50Ω) and an output impedance is set to be high (for example, 200Ω), thereby realizing impedance matching with a circuit on the ante stage and a circuit on the post stage.

The electrode finger pitches (hereinafter, referred to a pitch) of the IDT electrodes 11, 12, 13, 15, 16, and 17, and the dummy electrodes D1 and D2 are the same.

As it is well known by the person skilled in the art, the first double mode SAW filter shown in FIG. 5 operates as follows. A plurality of surface waves excited by the IDT electrodes 11, 12, and 13 are trapped between the reflectors 14a and 14b and are acoustically coupled. Two longitudinal resonance modes in the first and the third-order are forcedly excited by the IDT electrode pattern. Consequently, by carrying out proper termination, the first double mode SAW filter operates as a double mode SAW filter using the two modes. The pass. band width of the double mode SAW filter is determined by a frequency difference between the first-order resonance mode and the third-order resonance mode. The operation of the second double mode SAW filter is similar to that of the first double mode SAW filter.

The filter is configured as a cascaded type filter so that, attenuation of the filter is set to be higher than that of a single filter and an attenuation of the outside of the passband is increased.

FIG. 6(a) shows a filter characteristic in the case where a 39° Y-cut X-propagating $LiTaO_3$ is used for a piezoelectric substrate, 19.5 pairs of electrode fingers are used in the center IDT electrode 11, 13.5 pairs of electrode fingers are used in the center IDT electrode 15, 13.5 pairs of electrode fingers are used in each of the IDT electrodes 12, 13, 16, and 17, the number of each of the dummy electrodes D1 and D2 is six, the number of each of the reflectors 14a, 14b, 18a, and 18b is 200, and the electrode film thickness is 6.5%λ ($\lambda$ is a wavelength defined by the electrode) to thereby manufacture a cascaded double mode SAW filter having a center frequency of 881.5 MHz, a pass band width of 25 MHz, an input impedance of 50Ω, and an output impedance of 200Ω.

In the conventional cascaded filter in which the input and output impedances are different from each other, however, like the passband characteristic of the filter shown in FIG. 6(a), a large ripple occurs on the low passband side. There is a problem such that the filter is out of the specification of 3.5 dB or less required as the. specification of an RF filter of a portable telephone in the pass band from 869 MHz to 894 MHz (the pass band width is shown by hatched area). Further, as FIG. 6(b) shows a voltage standing wave ratio (VSWR) measured from both the input side (solid line) and the output side (broken line), there is also a problem such that the filter is out of the specification that the hatched VSWR is two or less in the pass band width.

FIGS. 7(a) and 7(b) are Smith charts obtained by measurement from both input and output sides of the cascaded filter, and large cycles are drawn around the passband. As obviously understood from the curve, each of the input and output impedances of the filter is not equal to 50Ω. Since the input and output impedances of the filter are designed as 50Ω and 200Ω, respectively, an impedance transformer is used to measure the VSWR on the output side.

As means for realizing a flat passband of an RF filter, it is known that an inductance is connected in parallel with a terminal impedance to achieve impedance matching. FIGS. 8(a) and 8(b) are Smith charts measured in such a manner that 50Ω is unchanged on the input side but an inductance of 39 nH is connected in parallel on the output side. FIG. 8(a) is measured from the input side and FIG. 8(b) is measured from the output side via a transformer. It is understood that even when the inductance is connected in parallel on the output side, the impedance characteristic on the input/output sides is not improved.

The present invention has been achieved to solve the problems and its object is to provide a cascaded filter having a flat passband characteristic and having the VSWR characteristic within a desired specification (2 or less).

DISCLOSURE OF THE INVENTION

To achieve the object, the invention according to claim 1 relates to a cascaded surface acoustic wave filter in which longitudinally coupled double mode SAW filters using the first and the third order modes are cascaded, in each of the double mode SAW filters, three IDT electrodes are disposed side by side between grating reflectors in a direction of propagation of a surface wave on the principal plane of a piezoelectric substrate, characterized in that a pitch of the IDT electrode in the center of one of the double mode SAW filters in said filter is set as L2, the number of electrode fingers of the IDT electrode is smaller than that of an IDT electrode disposed in the center of the other double mode SAW filter, and dummy electrodes having a pitch Ld are disposed of the number equal to the difference between the number of electrode fingers of the IDT electrode and that of the IDT electrode in the other double mode SAW filter, and the pitch L2 is set to be higher than an electrode finger pitch L1 of the other IDT electrodes.

The invention according to claim 2 relates to the cascaded surface acoustic wave filter according to claim 1, characterized in that 1.001<L2/L1<1.015.

The invention according to claim 3 relates to the cascaded surface acoustic wave filter according to claims 1 or 2, characterized in that the pitch Ld of the dummy electrode is set to be equal to L1.

The invention according to claim 4 relates to the cascaded surface acoustic. wave filter according to claims 1 or 2, characterized in that the pitch Ld of the dummy electrode is set to be equal to L2.

BEST MODE FOR CARRYING OUT THE INVENTION

Figure 1:
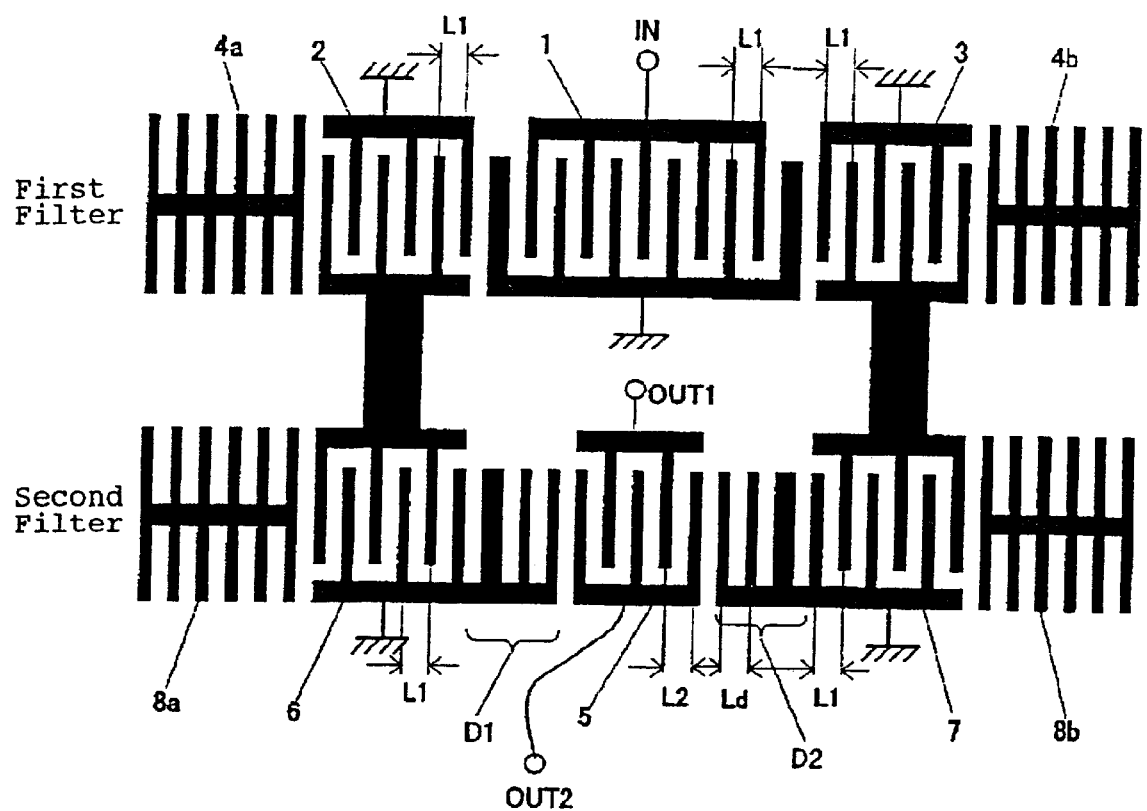
FIG. 1 is a plan view showing the configuration of a cascaded double mode SAW filter according to the invention.

The present invention will be described in detail hereinafter on the basis of embodiments shown in the drawings.

FIG. 1 is a plan view showing the configuration of a cascaded double mode filter according to the invention, in which input and output impedances are different from each other, the input side is an unbalanced form and the output side is a balanced form. A first double mode SAW filter is constructed by disposing three IDT electrodes 1, 2, and 3 side by side between reflectors 4a and 4b along a direction of propagation of a surface wave on the principal plane of a piezoelectric substrate (not shown). Further, in parallel with the first double mode SAW filter, a second double mode SAW filter is constructed by disposing three IDT electrodes 5, 6, and 7. side by side between reflectors 8a and 8b. By cascading the first and second double mode SAW filters, a cascaded double mode SAW filter is constructed.

Each of the IDT electrodes 1, 2, and 3 constructing the first double mode SAW filter is made by a pair of interdigital electrodes having a plurality of electrode fingers which positioned between the electrode fingers of the other. interdigital electrode. One of the interdigital electrodes of the IDT electrode 1 is connected to an input terminal IN, and the other interdigital electrode is grounded. Further, one of the interdigital electrodes of each of the IDT electrodes 2 and 3 is connected to an input terminal of the second double mode SAW filter and the other interdigital electrode is grounded.

The second double mode SAW filter is constructed almost similar to the first double mode SAW filter. However, the number of the electrode fingers of the center IDT 5 is less than that of the IDT electrode 1. That is, the center IDT electrode 5 is formed as if electrode fingers of the IDT electrode 1 are eliminated by the same number from both sides, and replacing the eliminated electrode fingers by interdigital dummy electrodes D1 and D2. The interdigital dummy electrode D1 is connected to one of interdigital electrodes (interdigital electrode on the ground side in the case of the diagram) of the IDT electrode 6. The interdigital dummy electrode D2 is connected to one of interdigital electrodes (interdigital electrode on the ground side in the case of the diagram) of the IDT electrode 7. The IDT electrodes 6 and 7 are disposed on both sides of the IDT electrode 5.

The pitch of each of the IDT electrodes 1, 2, and 3 is set as L1, the pitches of the IDT electrodes 5, 6, and 7 are set as L1, L2, and L1, respectively, and the pitch of each of the dummy electrodes D1 and D2 is set as Ld.

The present invention is characterized in that the pitches L1 and Ld of the IDT electrodes 1, 2, and 3, IDT electrodes 6 and 7, and dummy electrodes D1 and D2 are set to be equal to each other, and the pitch L2 of the IDT electrode 5 in the second double mode SAW filter is higher than each of L1 and Ld. The pitch L5 and the pitch Ld are set to be almost equal to each other (L2 Ld) and to be higher than the pitch L1.

Figure 2A:
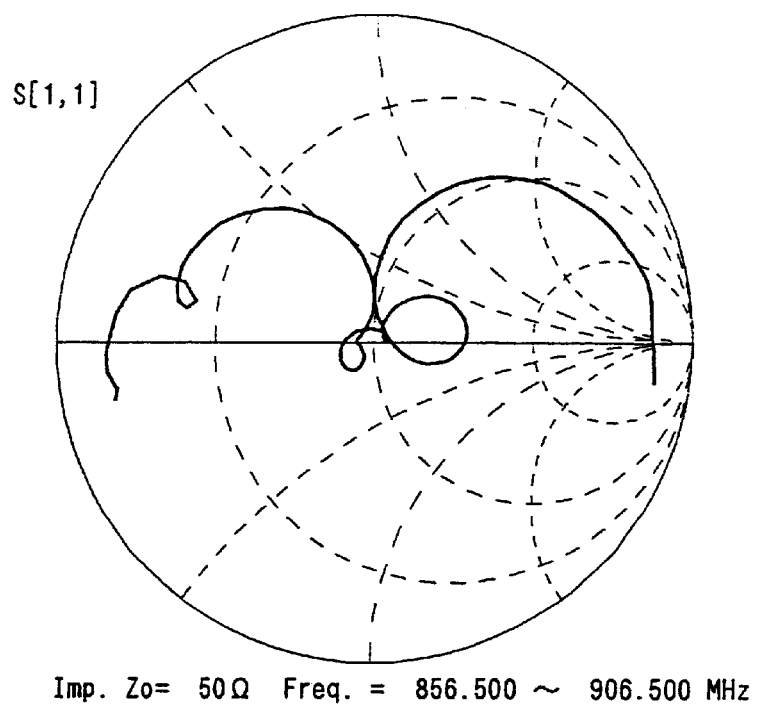
FIGS. 2(a) and 2(b) are Smith charts showing a cascaded double mode SAW filter according to the invention, measured from the input side and the output side, respectively.
Figure 2B:
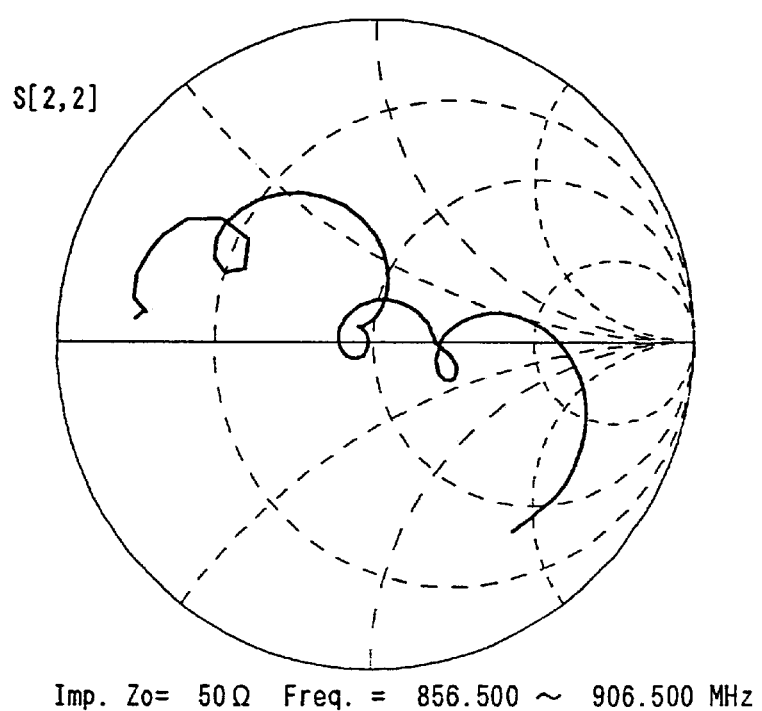

A cascaded double mode SAW filter having a center frequency of 881.5 MHz, a bandwidth of 25 MHz, an input impedance of 50Ω, and an output impedance of 200Ω was trial manufactured. The pitches L2 and Ld were set to be almost equal to each other and higher than the pitch L1 (L2/L1=1.012). FIGS. 2(a) and 2(b) are Smith charts measured from the input and output sides of the filter in the case where a 39° Y-cut X-propagating $LiTaO_3$ is used for a piezoelectric substrate, 19.5 pairs of electrode fingers are used in the center IDT electrode 1, 13.5 pairs of electrode fingers are used in the center IDT electrode 5, 13.5 pairs of electrode fingers are used in each of the IDT electrodes 2, 3, 6, and 7, the number of each of the dummy electrodes D1 and D2 is six, the number of each of the reflectors 4a, 4b, 8a, and 8b is 200, and the electrode film thickness is 6.5%λ. (λ=2L1). An inductance 39 nH is connected in parallel on the output side of the filter.

As obvious from FIGS. 2(a) and 2(b), it was confirmed that the impedance curve: draws circles around 50Ω in and around the passband-of the filter.

Figure 3A:
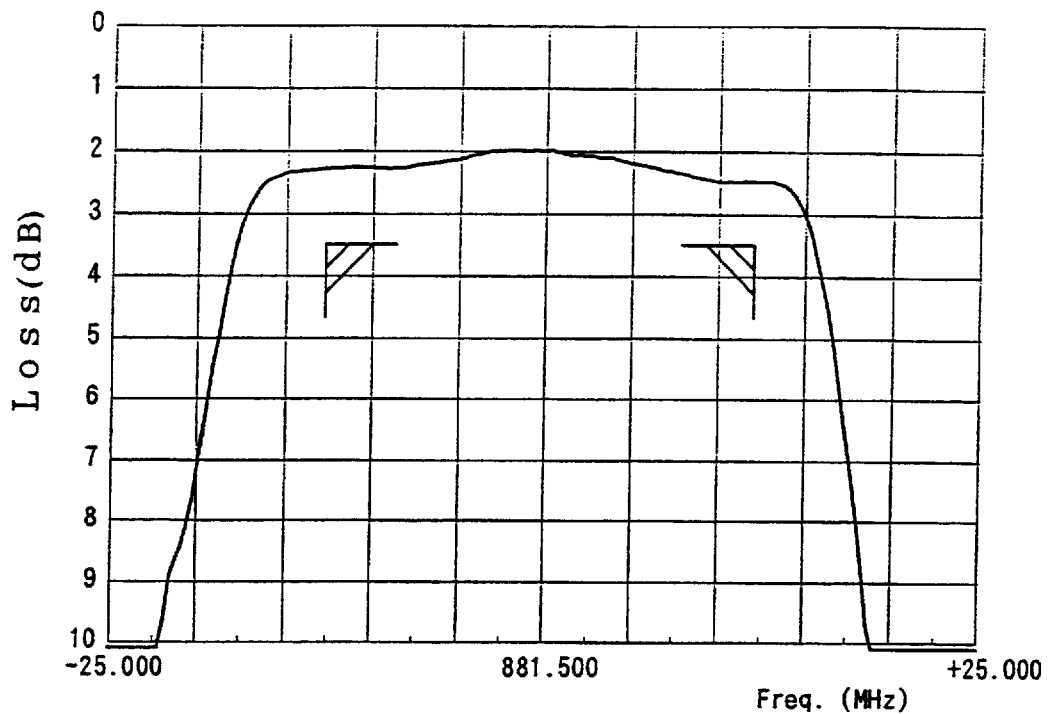
FIGS. 3(a) and 3(b) are diagrams showing a passband characteristic and a VSWR characteristic in/around the passband of a cascaded double mode SAW filter according to the invention, respectively.
Figure 3B:
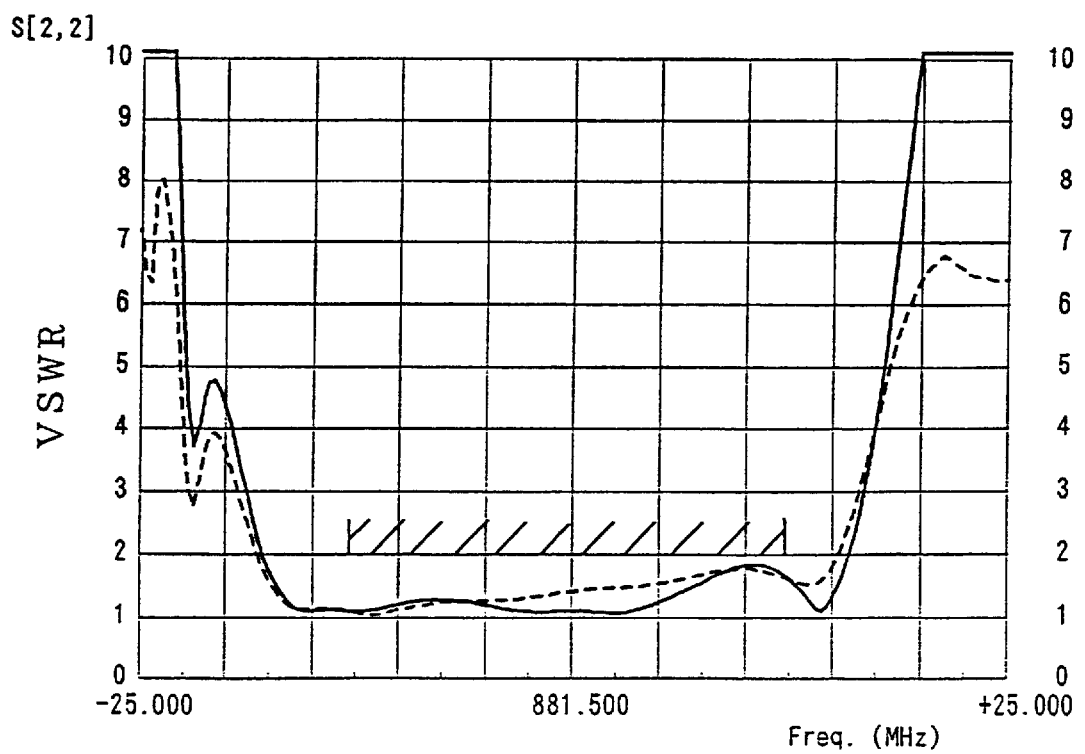

FIG. 3(a) shows a passband characteristic of the cascaded filter, satisfying both a frequency equal to or higher than 25 MHz as a required specification and an insertion loss equal to or lower than 3.5 dB. It is obviously understood from FIG. 3(b) that measurement values on the input side (solid line) and the output side (broken line) of the VSWR in/around the passband are lower than 2 which is the required specification.

From various experiments, it was found that when the electrode finger pitch ratio L2/L1 is higher than 1.001 and equal to or lower than 1.015 in consideration of variations caused by etching and the like, the passband characteristic of the filter can be flattened and the VSWR can be set to a desired value.

Figure 4:
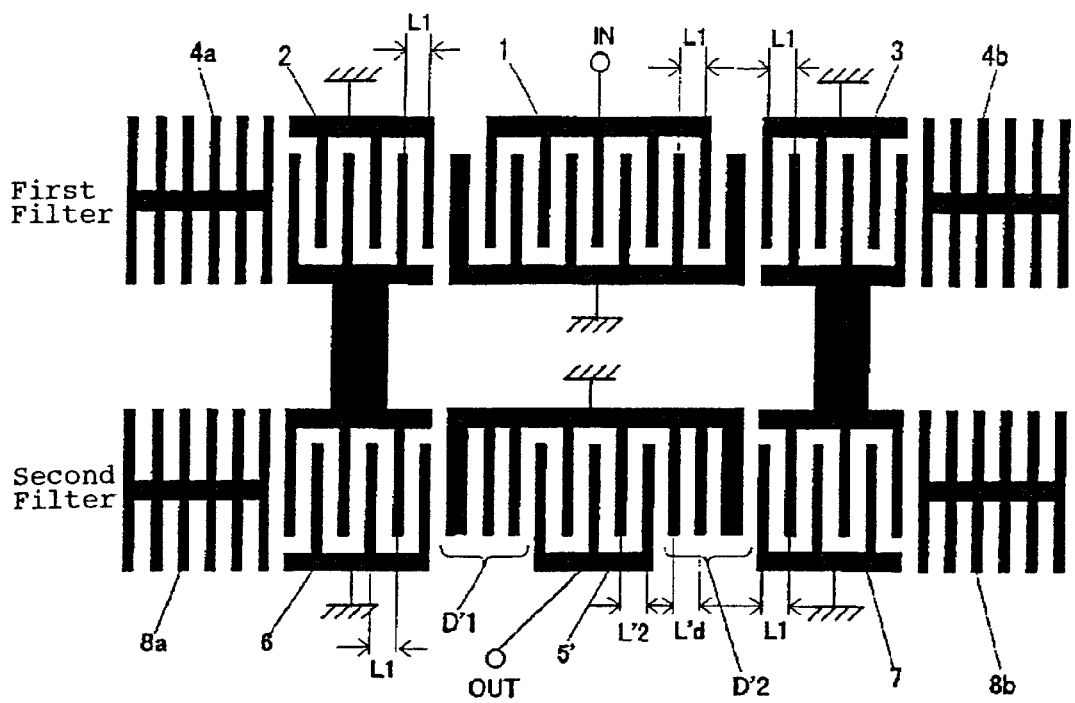
FIG. 4 is a plan view showing the configuration of a cascaded double mode SAW filter according to another embodiment of the invention.
Figure 5:
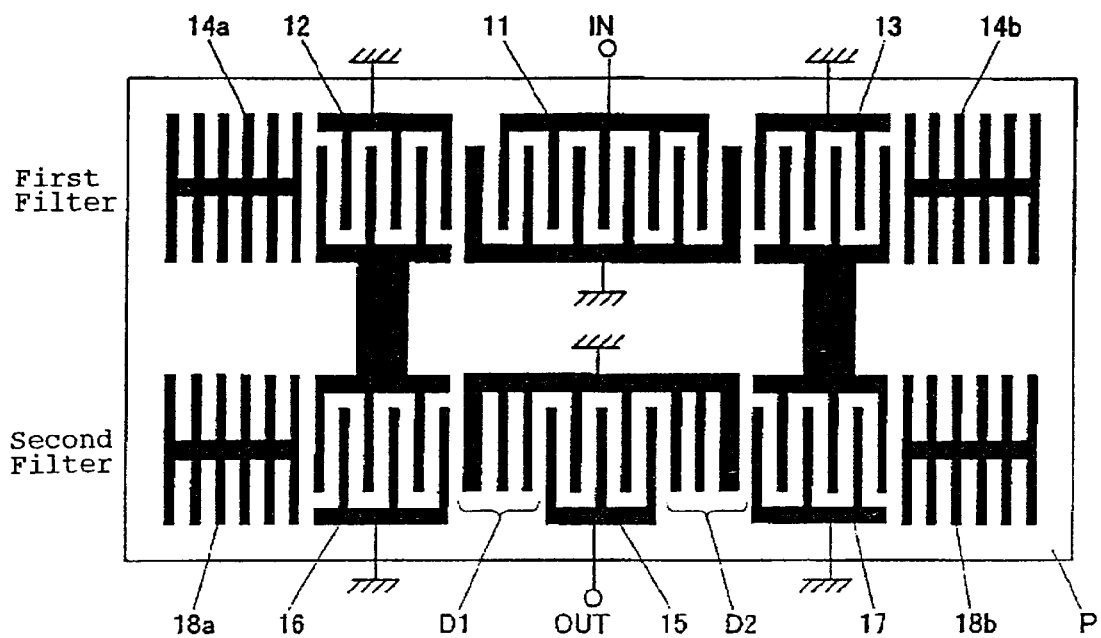
FIG. 5 is a plan view showing the configuration of a conventional cascaded double mode SAW filter.
Figure 6A:
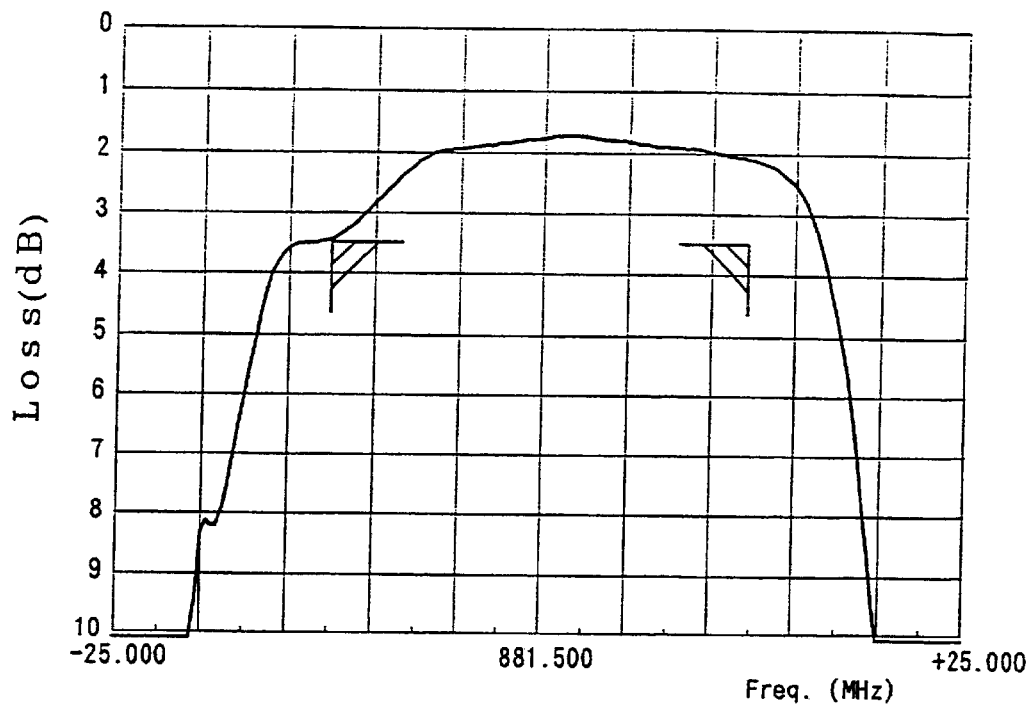
FIGS. 6(a) and 6(b) are diagrams showing a passband characteristic and a VSWR characteristic in/around the passband of a conventional cascaded double mode SAW filter, respectively.
Figure 6B:
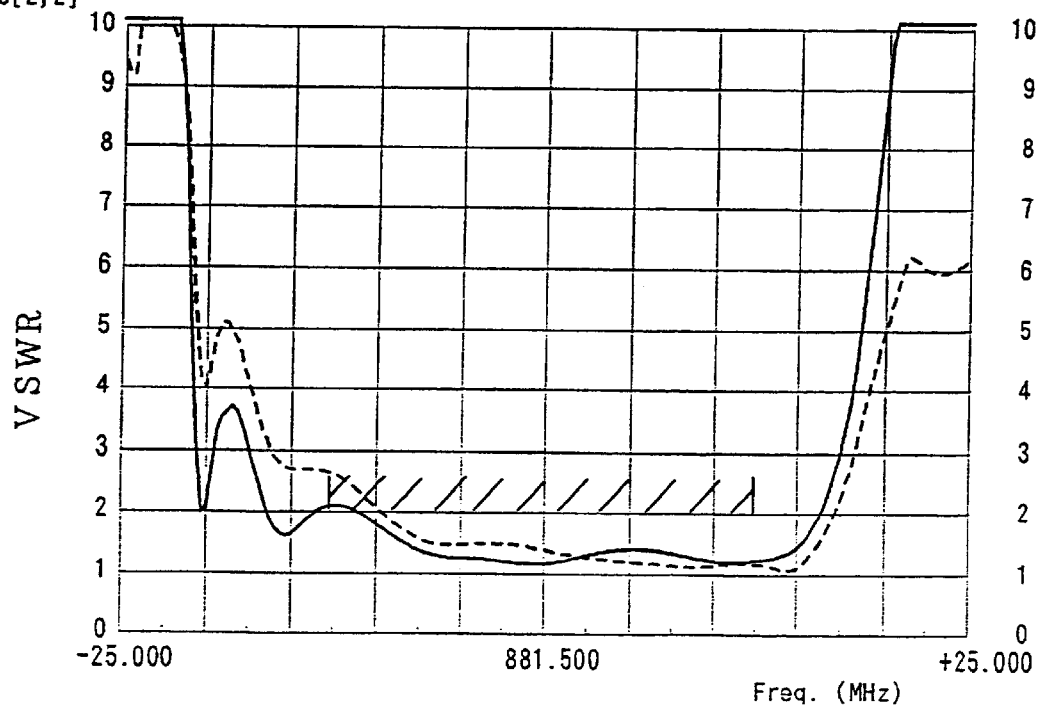
Figure 7A:
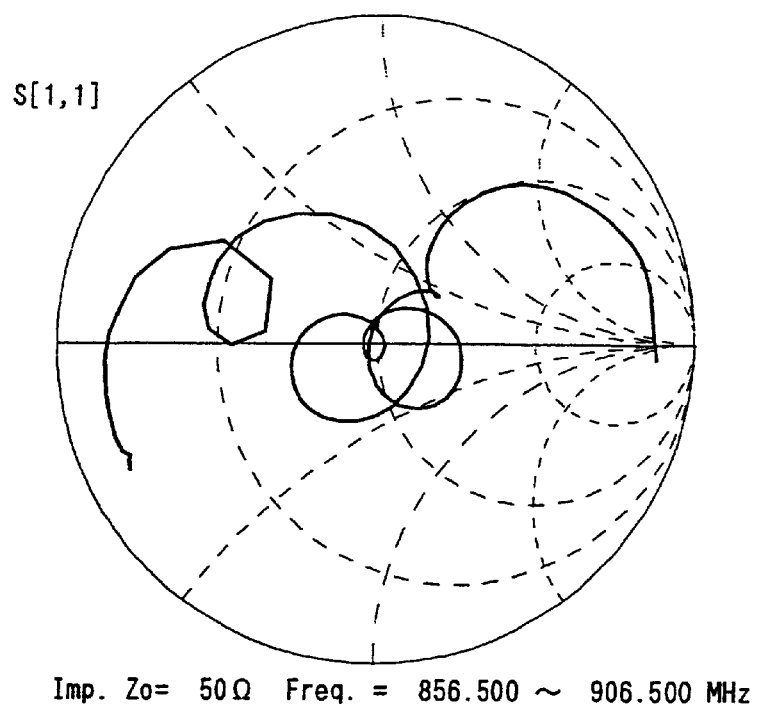
FIGS. 7(a) and 7(b) are Smith charts showing a conventional cascaded double mode SAW filter, measured from the input side and the output side, respectively.
Figure 7B:
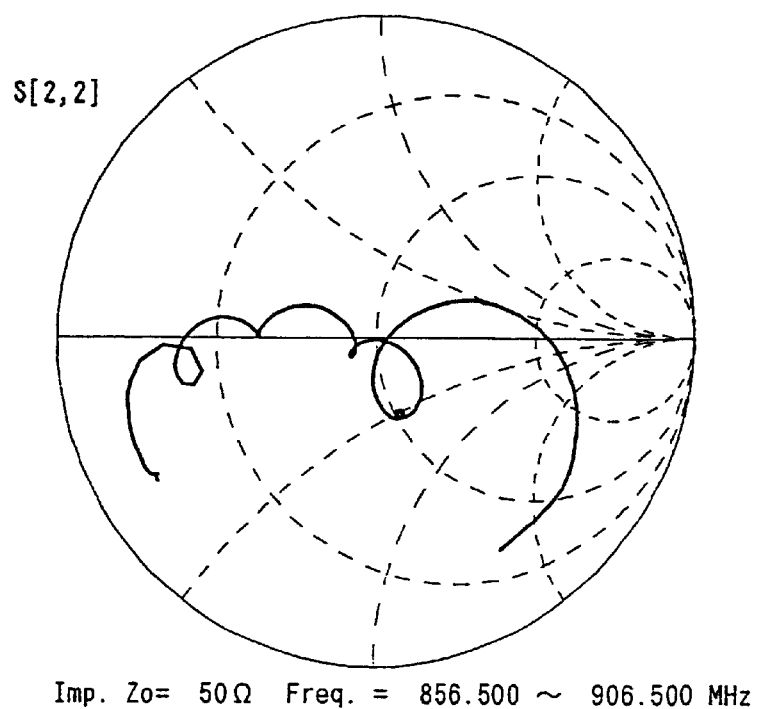
Figure 8A:
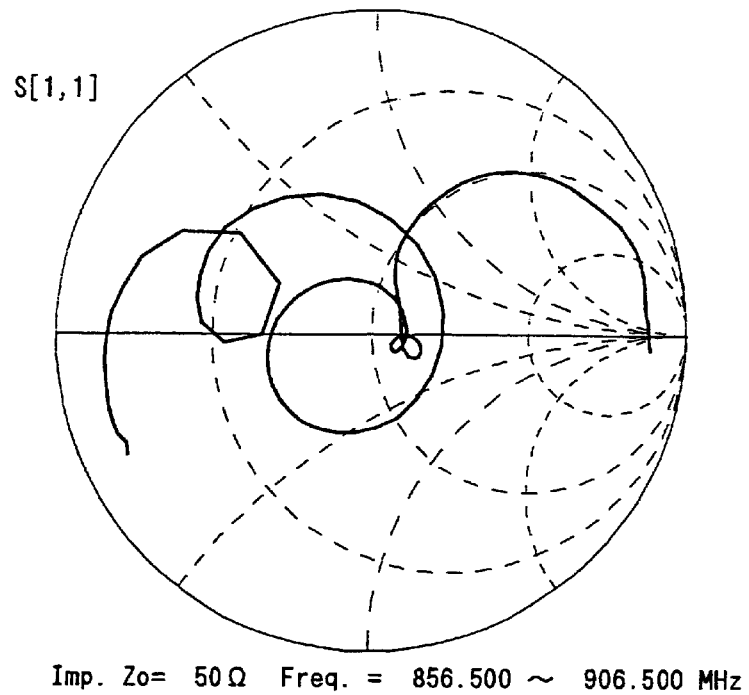
FIGS. 8(a) and 8(b) are Smith charts showing a case where an inductance is connected in parallel to a conventional cascaded double mode SAW filter, measured from the input side and the output side, respectively.
Figure 8B:
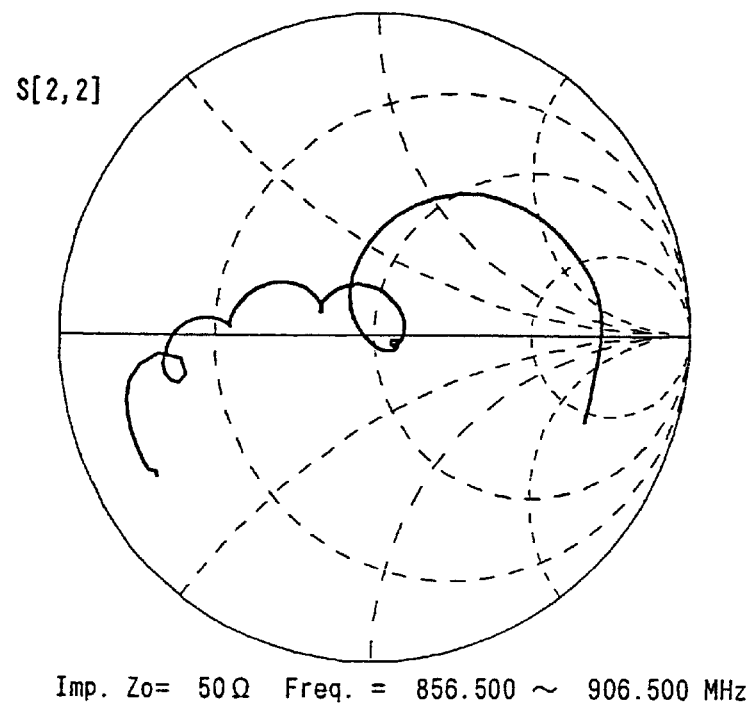

FIG. 4 is a plan view showing the configuration of a cascaded double mode SAW filter according to another embodiment of the invention, in which both input and output sides are unbalanced form, and input and output impedances are different from each other. An IDT electrode 5' in the center of a second double mode SAW filter and dummy electrodes D'1 and D'2 are different from FIG. 1. Specifically, in the second double mode SAW filter, the dummy electrodes D'1 and D'2 are provided between the center IDT electrode 5' and the IDT electrodes 6 and 7 on both sides of the center IDT electrode 5', respectively, and the dummy electrodes D'1 and D'2 are connected to an interdigital electrode on the earth side in a pair of interdigital electrodes of the IDT electrode 5'. The other interdigital electrode is used for output. The pitches of the IDT electrodes 1, 2, 3, 6, and 7 are equal to each other and are set as L1, the pitch of the IDT electrode 5' is set as L'2, and each of the dummy electrodes D'1 and D'2 is set as L'd. The embodiment of the present invention, characterized in that L'2 L'd and L'2 >L1.

From our various experiments, it was found that when the electrode finger pitch ratio L'2/L1 is higher than 1.001 and is equal to or lower than 1.015, desired passband characteristic and VSWR are satisfied.

Although the RF filter using the 39° Y-cut X-propagating LiTaO$_3$ for the piezoelectric substrate and to be applied to a portable telephone has been described above as an example, the invention is not limited to the embodiment described the above. The invention may also be applied to RF filters for other applications, each using a piezoelectric substrate made of lithium niobate(LiNbO$_3$), lithium tetraborate(Li$_2$B$_4$O$_7$), Langasite(La$_3$B$_4$O$_7$) or the like.

According to the invention, with the configuration as described above, the passband of the cascaded double mode SAW filter having input/output impedances different from each other can be flattened, and an RF filter in which the VSWR in/around the pass band is equal to or lower than 2 can be realized. Moreover, according to the invention, a filter having an unbalanced input and a balanced output can also be constructed. When such a filter is used in, for example, a portable telephone having therein a digital circuit and an analog circuit, an excellent effect on noise reduction is produced.

What is claimed is:

1. A longitudinally coupled double mode SAW filters using the first and the third modes are cascaded, in each of the double mode SAW filters, three IDT electrodes are disposed side by side between grating reflectors in a direction of propagation of a surface wave on the principal plane of a piezoelectric substrate, characterized in that a pitch of the IDT electrode in the center of one of the double mode SAW filters in said filter is set as L2, the number of electrode fingers of the IDT electrode is smaller than that of an IDT electrode disposed in the center of the other double mode SAW filter, and dummy electrodes having a pitch Ld are disposed of the number equal to the difference between the number of electrode fingers of the IDT electrode and that of the IDT electrode in the other double mode SAW filter, and the pitch L2 is set to be higher than an electrode finger pitch L1 of the other IDT electrodes.

2. The longitudinally coupled double mode SAW filters according to claim 1, characterized in that 1.001<L2/L1<1.015.

3. The longitudinally coupled double mode SAW filters according to claims 1 or 2, characterized in that the pitch Ld of said dummy electrode is set to be equal to L1.

4. The longitudinally coupled double mode SAW filters according to claims 1 or 2, characterized in that the pitch Ld of said dummy electrode is set to be equal to L2.

* * * * *